United States Patent
Beckers et al.

(10) Patent No.: US 9,127,196 B2
(45) Date of Patent: Sep. 8, 2015

(54) TIN PHOSPHATE GLASS CONTAINING EMBEDDED LUMINESCENT MATERIAL PARTICLES

(75) Inventors: Lucas Johannes Anna Maria Beckers, Veldhoven (NL); Paulus Hubertus Gerardus Offermans, Weert (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/001,329

(22) PCT Filed: Feb. 28, 2012

(86) PCT No.: PCT/IB2012/050920
§ 371 (c)(1),
(2), (4) Date: Aug. 23, 2013

(87) PCT Pub. No.: WO2012/117346
PCT Pub. Date: Sep. 7, 2012

(65) Prior Publication Data
US 2013/0334957 A1     Dec. 19, 2013

(30) Foreign Application Priority Data
Mar. 2, 2011 (EP) .................................. 11156628

(51) Int. Cl.
| C09K 11/02 | (2006.01) |
| C03C 14/00 | (2006.01) |
| C09K 11/08 | (2006.01) |
| C09K 11/77 | (2006.01) |
| H01L 33/50 | (2010.01) |
| H05B 33/14 | (2006.01) |

(52) U.S. Cl.
CPC ............. *C09K 11/025* (2013.01); *C03C 14/004* (2013.01); *C09K 11/0883* (2013.01); *C09K 11/7734* (2013.01); *C09K 11/7774* (2013.01); *H01L 33/501* (2013.01); *H05B 33/145* (2013.01); *C03C 2214/04* (2013.01); *H01L 33/502* (2013.01)

(58) Field of Classification Search
CPC ............ C03C 14/004; C03C 2214/04; C09K 11/0083; C09K 11/7734; C09K 11/7774; H01L 33/501; H01L 33/502; H05B 33/145
USPC ........................................................ 313/503
See application file for complete search history.

(56) References Cited

U.S. PATENT DOCUMENTS

| 4,314,031 A * | 2/1982 | Sanford et al. ................... 501/44 |
| 4,379,070 A * | 4/1983 | Tick ......................... 252/301.16 |
| 2004/0256706 A1 | 12/2004 | Nakashima |

(Continued)

FOREIGN PATENT DOCUMENTS

| GB | 476945 | 12/1937 |
| GB | 1525303 | 9/1978 |
| JP | 2010157577 A | 7/2010 |

(Continued)

*Primary Examiner* — Thomas A Hollweg
(74) *Attorney, Agent, or Firm* — Yuliya Mathis

(57) ABSTRACT

The invention provides a tin phosphate glass containing embedded luminescent material particles, wherein the luminescent material particles comprise luminescent material from the class of CaAlSiN 3:Eu 2+ and optionally other luminescent material particles. The invention further provides a method for the production of such glass as well as a lighting unit using such glass as (part of) a light conversion unit.

17 Claims, 2 Drawing Sheets

(56) References Cited

U.S. PATENT DOCUMENTS

2009/0072700 A1 3/2009 Kameshima et al.
2009/0186433 A1 7/2009 Yamaguchi et al.

FOREIGN PATENT DOCUMENTS

JP 2010229002 A * 10/2010
WO 2008035283 A2 3/2008

* cited by examiner

TIN PHOSPHATE GLASS CONTAINING EMBEDDED LUMINESCENT MATERIAL PARTICLES

FIELD OF THE INVENTION

The invention relates to a tin phosphate glass, a method for the production thereof, and a lighting unit comprising such tin phosphate glass.

BACKGROUND OF THE INVENTION

Bodies consisting of glass-type materials containing luminescent materials are known in the art. US2009186433, for instance, describes a method of making a light emitting device including mixing a glass powder with a luminescent material powder including at least one of a sulfide luminescent material, an aluminate luminescent material and a silicate luminescent material to produce a mixed powder in which the luminescent material powder is dispersed in the glass powder, heating and softening the mixed powder to provide an integrated material, and subsequently solidifying the integrated material to provide a luminescent material-dispersed glass, and fusion-bonding the luminescent material-dispersed glass onto a mounting portion on which a light emitting element is mounted by hot pressing, and simultaneously sealing the light emitting element with the luminescent material-dispersed glass on the mounting portion.

SUMMARY OF THE INVENTION

Yellow inorganic luminescent materials in combination with blue LEDs now seem to be commodity in producing white LED lamps. In this way, cold light can be provided. For long lifetime LED lamps, inorganic solutions seem to be needed, since organic materials are not stable with respect to blue/UV light and high temperatures >120° C.

Presently, luminescent materials are sometimes incorporated in ceramic bodies. An option within the context of inorganic luminescent materials in combination with LED light sources could be to incorporate luminescent materials in glass instead of in a ceramic body. However, it appears that some luminescent materials, especially nitride based luminescent materials, cannot (easily) be incorporated into glasses without damage or even disintegration of the luminescent material. It also appears that some luminescent materials are not compatible when heating together, as may happen when making glasses containing a combination of two or more different luminescent materials.

Yellow inorganic luminescent materials are typical garnet type systems like YAG and LuAG with their specific dopes, especially $Ce^{3+}$. Red inorganic luminescent materials may for instance be silicon nitride based structures. Co-firing of these red and yellow luminescent materials appeared to lead to badly luminescent products. Silicon nitride luminescent materials and garnet luminescent materials appear to be reactive and may destroy each other. This leads to worse optical properties, which is of course not desired. A solution could be to process the different inorganic luminescent materials separately as ceramic plates or glasses. This is however less desired, since it complicates the production process. Further, it may also complicate adjustment of optical properties.

Hence, it is an aspect of the invention to provide an alternative glass containing luminescent material, an alternative method for the production thereof, and an alternative lighting unit comprising such alternative glass, which preferably further at least partly obviate one or more of above-described drawbacks.

Surprisingly, a glass was found wherein a red inorganic luminescent material could be dispersed, and wherein even a combination with other luminescent materials could be dispersed without substantial detrimental effects on the luminescent properties. It was found that red silicon nitride luminescent material particles could be packaged into a glass matrix of tin phosphate glass and it appeared that both red and yellow luminescent material particles could be dispersed (processed) in the same glass matrix. Hence, a low temperature melting glass, especially tin phosphate glass ($T_g$ is especially in the range of 160-250° C., more especially 180-210° C. and $T_m$ is especially in the range of 250-350° C., more especially 290-310° C.), with good optical properties is used as glass component.

Hence, in a first aspect, the invention provides a tin phosphate glass containing embedded luminescent material particles, wherein the luminescent material particles comprise luminescent material from the class of $CaAlSiN_3:Eu^{2+}$.

In such glass, luminescent material, especially the indicated red emitting luminescent material may be dispersed, without substantial damage of the luminescent material. Also a combination of luminescent material may be dispersed in the glass.

The tin phosphate glass may especially have the chemical formula of $Sn_3(PO_4)_4$, although, as is known with glasses, the stoichiometry may (locally) slightly differ. Hence, the tin phosphate glass may especially have the chemical formula of $Sn_3(PO_4)_4$ or close to said stoichiometry. The fact that the glass is a tin phosphate glass does, in an embodiment, not exclude the presence of one or more other elements in the glass than Sn, P and O (not taking into account the dispersed luminescent particles, which comprise (further) different elements per se, such as for instance, one or more of Y, Eu and Ce, etc.). For instance, small amounts of one or more other elements may be present in the glass (phase).

The luminescent material is dispersed as particles in the glass. This is herein indicated as that the luminescent material particles are embedded in the glass. This may for instance be visible with SEM (see also figures). The luminescent material particles at least comprise particles from the class of $CaAlSiN_3:Eu^{2+}$.

The phrase "class of $CaAlSiN_3:Eu^{2+}$" may imply that the luminescent material is of the type $MAlSiN_3:Eu^{2+}$, wherein M may relate to one or more of Ca, Sr and Ba. Especially, M relates to Ca and/or Sr, especially at least 80 mol % Ca relative to the total number of moles of alkaline earth element M. Hence, in an embodiment, the invention provides such glass, wherein the luminescent material particles comprise luminescent $(Ca,Sr)AlSiN_3:Eu^{2+}$. As example, $Ca_{0.85}Sr_{0.15}AlSiN_3:Eu^{2+}$ is given. Assuming for instance 0.5% europium, the formula could be $Ca_{0.85}Sr_{0.145}Eu_{0.005}AlSiN_3$.

The phrase "class of $CaAlSiN_3:Eu^{2+}$" may alternatively or additionally also imply that other elements may partly be replaced. For instance, Al may partly be replaced by Ga; Si may partly be replaced by Ge; and N may partly be replaced by O. In the latter case, charge compensation may be necessary, for instance by some exchange of Si to Al. Preferably, the M element is at least 80 mol % Ca relative to the total number moles of alkaline earth element M, and the other elements Al, Si, N are not replaced by other elements, or only in an extend to 2 mol % or less, relative to the respective elements.

Optionally, the $CaAlSiN_3:Eu^{2+}$ material may contain further luminescent ions, like $Mn^{2+}$.

As indicated above, the glass may also contain other luminescent materials. Hence, in an embodiment, the tin phosphate glass further contains one or more other types of embedded luminescent material particles. Again, also those type of particles may be distinguished in the glass, for instance with SEM and/or EDAX. Hence, the glass may have particles of two or more luminescent material types embedded.

Especially, the glass may contain embedded luminescent material particles comprising luminescent material from the class of $Y_3Al_5O_{12}:Ce^{3+}$.

Those luminescent materials together, when mixed in the appropriate amounts, may lead to white light when excited with blue or UV light. Dependent upon the amount and the color of excitation light, the light emanating from the combination of light source and glass may be warm white or cool white, or may be colored.

The phrase "the class of $Y_3Al_5O_{12}:Ce^{3+}$" again indicates that one or more of Y, Al and O may at least partially be replaced by other elements. Especially, Y may at least partially be replaced by Gd, Tb, Lu. Further, Al may at least partially be replaced by Ga, or even Si, and O may at least partially be replaced by N. In the latter cases, charge compensation may be desired. Especially, the replacement of Al and O is equal to or less than 2%, relative to Al and O, respectively. Y may especially be at least partly replaced by Lu. Hence, in an embodiment, the luminescent material of the class of $Y_3Al_5O_{12}:Ce^{3+}$ may also comprise the class of $Lu_3Al_5O_{12}:Ce^{3+}$.

The term "luminescent material" may also comprise a plurality of luminescent materials. The term "luminescent material particles" may in an embodiment also relate to a plurality of different types of luminescent material particles, such particles of the class of $Y_3Al_5O_{12}:Ce^{3+}$ and particles of the class of $CaAlSiN_3:Eu^2$, but may in another embodiment for instance also relate to a glass containing embedded particles of $Y_3Al_5O_{12}:Ce^{3+}$, $Lu_3Al_5O_{12}:Ce^{3+}$, $CaAlSiN_3:Eu^2$, and for instance $(Ca_{0.9}Sr_{0.1})AlSiN_3:Eu^{2+}$, respectively.

If desired, the luminescent material particles may be coated. Further, the weight percentage of the total amount of luminescent material particles relative to the total weight of the thin phosphate glass may be in the range of 0.5-20 wt. %, such as in the range of 1-15 wt. %.

The tin phosphate glass may especially be obtainable by vitrification of a tin source and a phosphate source in the presence of luminescent material particles. This may be performed in several ways, see also below. Vitrification herein especially means the transformation of a substance into a glass.

In a further aspect, the invention provides a method for the production of a tin phosphate glass containing embedded luminescent material particles, the method comprising vitrifying a tin source and phosphate source, in the presence of luminescent material particles, especially wherein the luminescent material particles comprise luminescent material from the class of $CaAlSiN_3:Eu^{2+}$. For instance, the tin source and phosphate source may be heated until a liquid glass is obtained. Then, the luminescent material particles may be added. Upon cooling down, often with a rapid temperature drop, the glass is formed.

Alternatively or additionally, the tin source and phosphate source may be heated until a liquid glass is obtained in the presence of the luminescent material particles. Upon cooling down, often with a rapid temperature drop, the glass is formed.

In a specific embodiment, the tin source and phosphate source are provided as tin phosphate glass particles. This may imply that first a tin phosphate glass is produced, and the thus obtained glass is particulated, for instance by grinding. The thus obtained glass particles may then be used as starting particles and may be vitrified into the glass of the invention, by the above defined method and method embodiments. Especially, the tin source comprises one or more of tin oxide (especially SnO) and tin oxalate ($SnC_2O_4$; stannous oxalate). Further, especially the phosphate source comprises one or more of $P_2O_5$ and $NH_4H_2PO_4$.

The above glass may especially be used for light conversion of light of a light source. Hence, the glass may be used as light conversion unit. In this way, UV light and/or blue light may for instance (partly) be converted in visible light. The luminescent materials may be selected to provide the desired color point and other desired optical properties. When UV light is used, for instance a blue emitting luminescent material may (additionally) be applied.

Hence, especially the light source is configured to provide light source light with a wavelength selected from the UV and blue range. The term "light source" may also refer to a plurality of light sources. Optionally, different types of light sources may be applied, such as a UV light source and a blue light source. Optionally, additional light sources may be applied to further tune the color point. For instance, in addition to one or more blue light sources, a green emitting and/or red emitting light source may be applied, irrespective of the fact that the tin phosphate glass comprises a red emitting luminescent material.

Hence, in a further aspect the invention provides a lighting unit comprising a light source and a light conversion unit, wherein the light conversion unit comprises the tin phosphate glass as described herein, wherein the light source is configured to provide light source light, and wherein the light conversion unit is configured to convert at least part of the light source light into visible light. The luminescent material particles embedded in the tin phosphate glass may in an embodiment have particle size dimensions in the range of 0.5-15 mum. Especially, 50% of the embedded particles has particle size dimensions in the range of 0.5-15 μm, such as in the range of 1-10 μm.

Especially, for instance in view of design aspects such as dimensions, but also in view of stability, the light source comprises a solid state light source (i.e. a solid state light emitting diode LED). Alternatively, the light source may comprise a laser diode.

The tin phosphate glass may be arranged at a distance or very close or even in physical contact with the light source. In an embodiment, the light source is a solid state light source with a LED die, and the tin phosphate glass is in physical contact with the LED die. This may be beneficial in view of dimensions and in view of efficiency. In an embodiment, the glass is directly bonded to the die. Optionally, an optical coupling paste may be applied between the die and the tin phosphate glass.

However, the tin phosphate glass may also be arranged remote from the light source. Especially, the invention also provides an embodiment of the lighting unit as described herein, comprising a light box, wherein the light source is contained in the light box, and wherein the light conversion unit is a light transmissive window of the light box. The light transmissive window of the light box in this embodiment comprises the tin phosphate glass (with embedded luminescent material particles). As will be clear to the person skilled in the art, the light box may comprise a plurality of light sources, optionally with one or more different types of light source light.

Hence, the invention especially provides for LED applications red luminescent inorganic silicon nitride luminescent material and optionally one or more other luminescent materials, such as yellow inorganic (YAG, LuAG family), embedded in a tin phosphate glass, thereby providing both a red and optionally a yellow luminescent material into one inorganic matrix.

The term "substantially" herein, such as in "substantially all emission" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings.

BRIEF DESCRIPTION OF THE DRAWINGS

Embodiments of the invention will now be described, by way of example only, with reference to the accompanying schematic drawings in which corresponding reference symbols indicate corresponding parts, and in which.

The drawings are not necessarily on scale.

Figure 3:
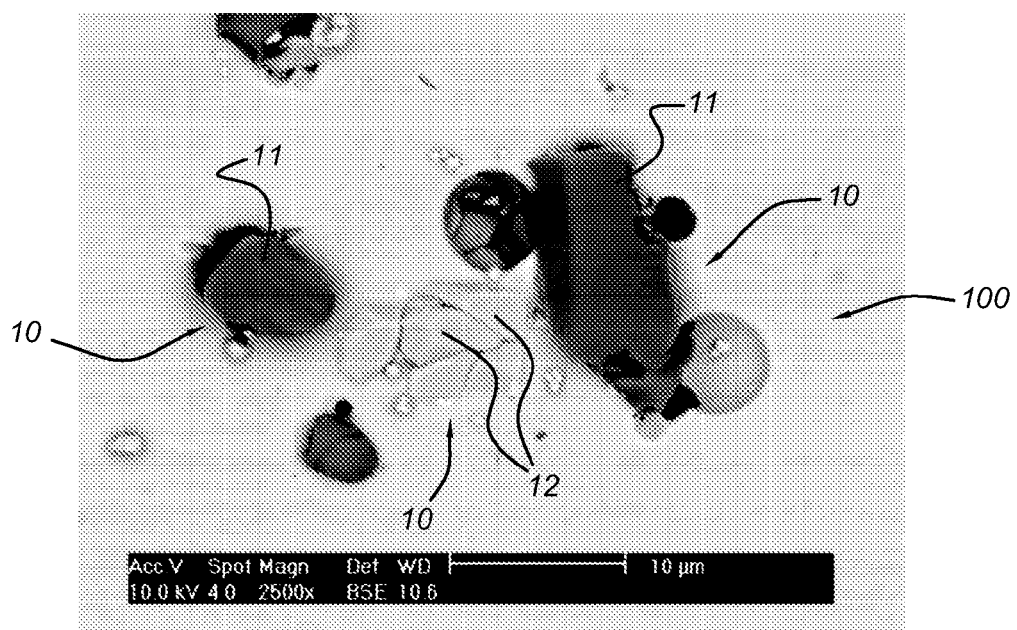

FIG. 3 shows a SEM picture of a the tin phosphate glass with luminescent material embedded.

DETAILED DESCRIPTION OF THE EMBODIMENTS

Figure 1A:
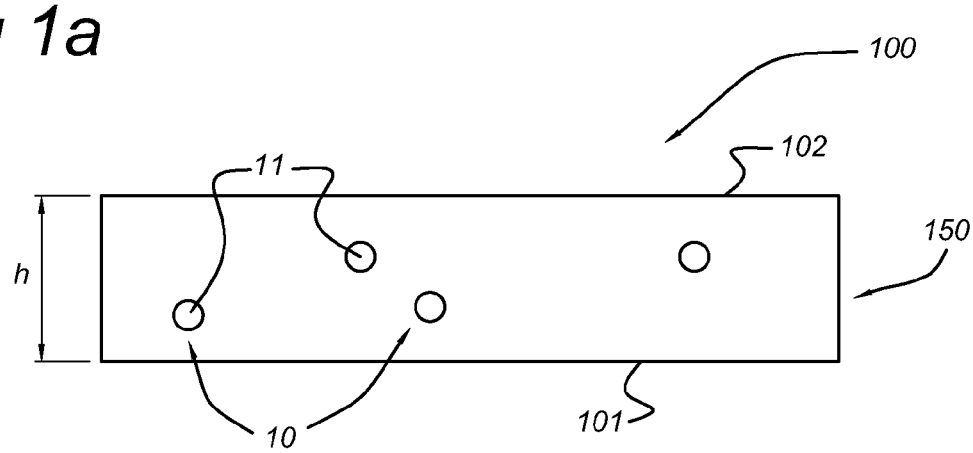
FIGS. 1a-1b schematically depict some embodiments of the tin phosphate glass.

FIG. 1a schematically depicts a tin phosphate glass 100 containing embedded luminescent material particles 10, wherein the luminescent material particles 10 comprise luminescent material from the class of $CaAlSiN_3:Eu^{2+}$. Reference 11 is used to indicate those specific class of ($CaAlSiN_3:Eu^{2+}$) particles.

The glass may be provided as a plate, having for instance a height h of 0.2-10 mm, such as 0.5-10 mm. Such plate may have first face 101 and an opposite second face 102 (at a distance of each other of h).

Figure 1B:
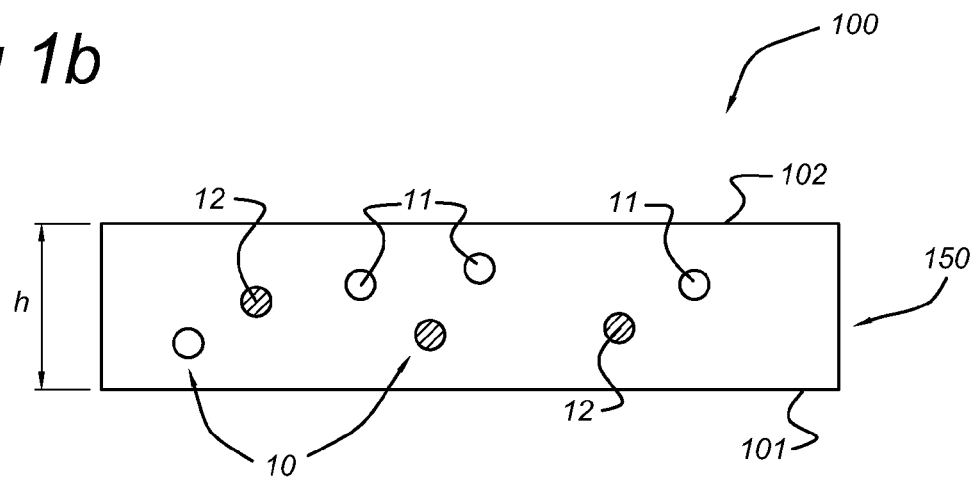

FIG. 1b schematically depicts the same embodiment, now with luminescent material particles 10 of a second type or class. Those luminescent particles of another class, such as cerium doped YAG, are indicated with reference 12.

The tin phosphate glass 100 can be used as light conversion unit or as part of a light conversion unit. Such light conversion unit is indicated with reference 150. For consistency with FIGS. 2a-2b, the tin phosphate glasses 100 are therefore also indicated as light conversion units 150.

Figure 2A:
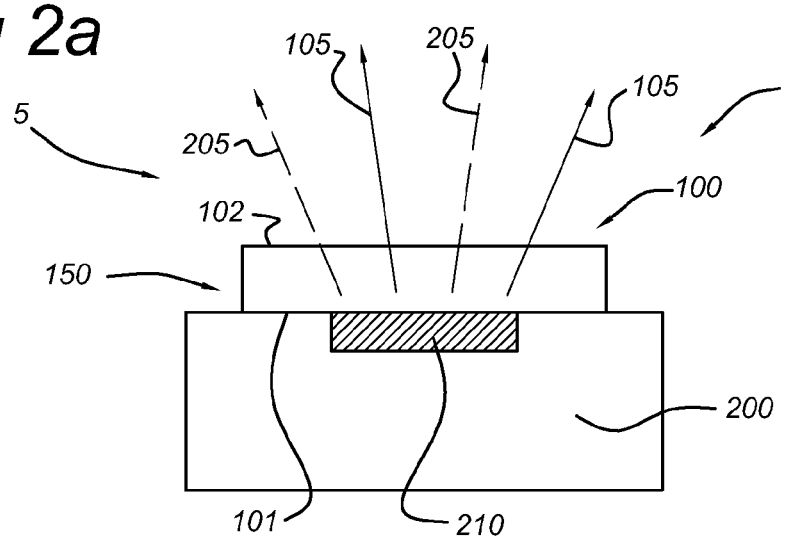
FIGS. 2a-2b schematically depict some embodiments of the lighting unit.
Figure 2B:
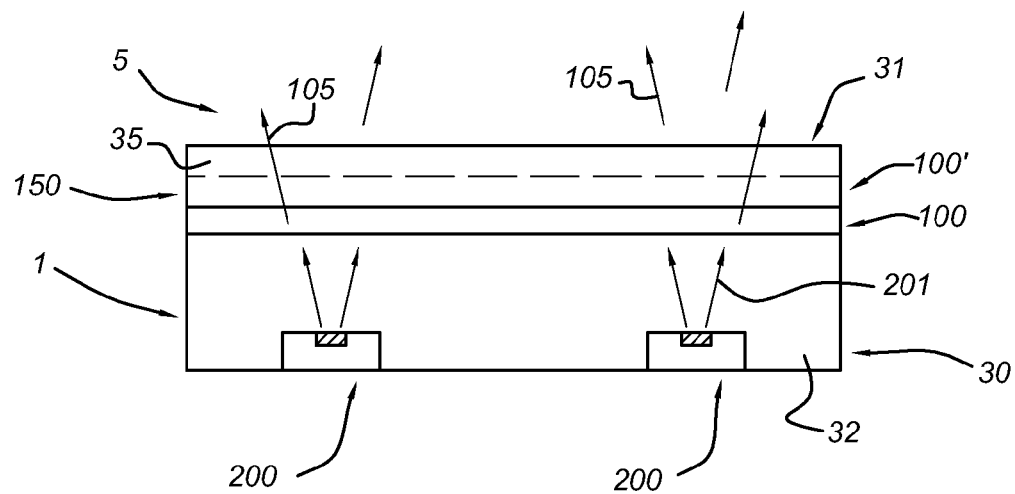

FIG. 2b schematically depicts an embodiment of a lighting unit 1 comprising a light source 200 and a light conversion unit 150 (see also above). The light conversion unit 150 comprises the tin phosphate glass 100. Here, in this schematic drawing the glass 100 is the light conversion unit. The light source 200 is configured to provide light source light 205. The light conversion unit 150, more especially the tin phosphate glass 100, even more especially the therein embedded luminescent material, is configured to convert at least part of the light source light 205 into visible light 105. The combination of visible light 105 of the luminescent material and the optional remaining (i.e. non-absorbed light source light 205) downstream of the light conversion unit 150 is indicated as (lighting unit) light 5.

In FIG. 2a, the light source 200 is a solid state light source with a LED die 210. By way of example, the tin phosphate glass 100 is in physical contact with the LED die 210. For instance, the tin phosphate glass 100 may be directly bonded to the die LED 210. Optionally, a light coupling paste may be arranged in between Optionally, the tin phosphate glass 100 may be remote from the light source 200. An example of such embodiment is schematically depicted in FIG. 2b. FIG. 2b schematically depicts an embodiment of the lighting unit 1, comprising a light box 30. The light source 200, or at least its light emitting part, is contained in the light box 30. The light conversion unit 150 is here a light transmissive window 31 of the light box 30. As indicated above, the tin phosphate glass 100 may comprise a plurality of luminescent material types.

Further, the lighting unit 1 may comprise a plurality of (tin phosphate) glasses 100, here indicated by tin phosphate glass 100 and a second glass 100', which may also be a tin phosphate glass but which may also be another glass. Alternatively, the lighting unit may comprise such tin phosphate glass 100 and a glass, optionally a tin phosphate glass, which comprises one or more other luminescent materials (than tin phosphate glass 100).

Further, the window 31 may comprise optional further optics, indicated with reference 35, like a diffuser, or a collimator (like an micro lens optic MLO layer). The interior of the light box 30 is indicated with reference 32. The light box 30 may have reflective surfaces (in an embodiment except for the window 31).

FIG. 3 shows a SEM graph of a tin phosphate glass 100. The entire graph shows the transmissive tin phosphate glass 100, with clearly present the luminescent material particles 10 embedded. Even, the different types of luminescent material particles are visible, including crystallographic edges/faces.

Tin phosphate glasses with dispersed red and yellow luminescent material particle are easy to detect by chemical analysis. See for example the SEM and EDAX measurement above.

EXPERIMENTAL

Example 1

The tin phosphate glass was milled in a crucible and mixed with calcium aluminum silicon nitride luminescent material. A powder compact of this mixture was heat treated in a furnace. The result was a pellet where red particles were dispersed in a clear glass matrix of tin phosphate. The pellet was tested onto blue LEDs and blue light was at least partly converted into red light.

Example 2

In a second experiment glass particles+red luminescent particles (11) and yellow luminescent particles (12) (YAG: Ce) particles were mixed and compacted. After heat treatment, again pellets were formed and tested on blue LEDs. Warm white light was generated by the luminescent material mix glass matrix (composite).

Example 3

All kind of glasses were tested on their ability to host the red luminescent material and to host a combination of luminescent materials. It appeared that from all investigated glasses only the tin phosphate glass had suitable properties.

For instance, tellurium phosphate glasses was prepared, but they were all colored (yellow/orange). The $T_g$ of these glasses were not lower than 300° C. The lowest T° measured of tellurium phosphate glass was 347° C.

The tin phosphate glasses made for this application have typical refractory indices between 1.5 and 1.7.

Example 4

Tin(II)oxide (SnO) powder 10 and Ammonium phosphate monobasic crystalline powder ($NH_4H_2PO_4$) were used for the preparation on tin phosphate glass. SnO and $NH_4H_2PO_4$ powders were mixed and heated in crucible. Water and ammonia was evaporated out. After some time, the glass was cast onto a cold steel plate. A colorless clear glassy matrix was frozen in and the $T_g$ is of these samples were between 190 and 200° C. $T_m$ was near 300° C.

The invention claimed is:

1. A tin phosphate glass essentially having a chemical formula of $Sn_3(PO_4)_4$ containing embedded luminescent material particles, wherein the luminescent material particles comprise luminescent material including $M\alpha_A\beta_B\Sigma_3:Eu^{2+}$, wherein M is at least one element selected from the group consisting of Ca, Sr or Ba, wherein α is selected from the group consisting of Al or (Al, Ga), wherein β is selected from the group consisting of Si or (Si, Ge), wherein Σ is selected from the group consisting of N or (N, O) and wherein A+B=2.

2. The tin phosphate glass according to claim 1, wherein M is (Ca,Sr), α is Al, β is Si, Σ is N, A=1 and B=1.

3. The tin phosphate glass according to claim 2, further containing one or more other types of embedded luminescent material particles.

4. The tin phosphate glass according to claim 3, further containing embedded luminescent material particles comprising luminescent material including $Z\alpha\phi_D\psi_G:Ce^{3+}$, wherein Z is at least one element selected from the group consisting of Y, Gd, Tb or Lu, wherein φ is at least one element selected from the group consisting of Al, Ga or Si, wherein ψ is least one element selected from u consisting of O or N and wherein D+G=17.

5. The tin phosphate glass according to claim 4, wherein D±5±2% and wherein G=12±2%.

6. The tin phosphate glass according to claim 4, wherein the tin phosphate glass is obtainable by the vitrification of a tin source and a phosphate source in the presence of luminescent material particles.

7. The tin phosphate glass according to claim 6, wherein the weight percentage of the total amount of luminescent material particles relative to the total weight of the thin phosphate glass is in the range of 0.5-20 wt. %.

8. A lighting unit comprising a light source and a light conversion unit, wherein the light conversion unit comprises the tin phosphate glass according to claim 7, wherein the light source is configured to provide light source light, and wherein the light conversion unit is configured to convert at least part of the light source light into visible light.

9. The lighting unit according to claim 8, wherein the light source comprises a solid state light source.

10. The lighting unit according to claim 9, wherein the light source is configured to provide light source light with a wavelength selected from the UV and blue range.

11. The lighting unit according to claim 10, wherein the light source is a solid state light source with a LED die, and wherein the tin phosphate glass is in physical contact with the LED die.

12. The lighting unit according to claim 10, wherein the tin phosphate glass is remote from the light source.

13. The lighting unit according to claim 12, comprising a light box, wherein the light source contained in the light box, and wherein the light conversion unit is a light transmissive window of the light box.

14. A method for the production of a tin phosphate glass essentially having a chemical formula of $Sn_3(PO_4)_4$ containing embedded luminescent material particles comprising vitrifying a tin source and phosphate source in the presence of luminescent material particles, wherein the luminescent material particles comprise luminescent material including $M\alpha_A\beta_B\Sigma_3:Eu2+$, wherein M is at least one element selected from the group consisting of Ca, Sr or Ba, wherein α is selected from the group consisting of Al or (Al, Ga), wherein β is selected from the group consisting of Si or (Si, Ge), wherein Σ is selected from the group consisting of N or (N, O) and wherein A+B=2.

15. The method according to claim 14, wherein the tin source comprises one or more of tin oxide and tin oxalate and wherein the phosphate source comprises cine or more of P2O5 and NH4H2PO4.

16. The method according to claim 14, wherein the tin source and phosphate source are provided as tin phosphate glass particles.

17. A tin phosphate glass essentially having a chemical formula of $Sn(PO_4)_4$ containing embedded luminescent material particles, wherein the luminescent material particles comprise a nitride-based luminescent material.

* * * * *